(12) United States Patent
Pore

(10) Patent No.: US 9,428,842 B2
(45) Date of Patent: Aug. 30, 2016

(54) METHODS FOR INCREASING GROWTH RATE DURING ATOMIC LAYER DEPOSITION OF THIN FILMS

(71) Applicant: ASM IP Holding B.V., Almere (NL)

(72) Inventor: Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 570 days.

(21) Appl. No.: 13/721,136

(22) Filed: Dec. 20, 2012

(65) Prior Publication Data

US 2014/0174342 A1 Jun. 26, 2014

(51) Int. Cl.
| | |
|---|---|
| C30B 25/16 | (2006.01) |
| C30B 25/02 | (2006.01) |
| C23C 16/14 | (2006.01) |
| C23C 16/30 | (2006.01) |
| C23C 16/455 | (2006.01) |

(52) U.S. Cl.
CPC ............... *C30B 25/16* (2013.01); *C23C 16/14* (2013.01); *C23C 16/306* (2013.01); *C23C 16/45534* (2013.01); *C23C 16/45553* (2013.01); *C30B 25/02* (2013.01)

(58) Field of Classification Search
CPC ....... C30B 25/00; C30B 25/02; C30B 25/16; C30B 25/165; C23C 16/00; C23C 16/44; C23C 16/455; C23C 16/45523; C23C 16/45525; C23C 16/45527; C23C 16/45531; C23C 16/45534; C23C 16/45553
USPC .......... 117/84, 88–90, 92–94, 102–106, 108, 117/937, 949
See application file for complete search history.

(56) References Cited

U.S. PATENT DOCUMENTS

| | | |
|---|---|---|
| 2002/0108570 A1 | 8/2002 | Lindfors |
| 2005/0092247 A1 | 5/2005 | Schmidt et al. |
| 2007/0020923 A1* | 1/2007 | Kraus ..................... C23C 16/34 438/644 |
| 2009/0324821 A1* | 12/2009 | Pore ....................... C23C 16/306 427/250 |
| 2010/0009078 A1 | 1/2010 | Pore et al. |
| 2011/0027976 A1* | 2/2011 | Lee ......................... C23C 16/042 438/483 |
| 2012/0329208 A1* | 12/2012 | Pore ....................... C23C 16/305 438/102 |

FOREIGN PATENT DOCUMENTS

| | | | |
|---|---|---|---|
| WO | WO 2011/056519 A2 | | 5/2011 |
| WO | WO 2011056519 A2 | * | 5/2011 |

OTHER PUBLICATIONS

Prof. M. Ritala and Prof. M. Leskela in a recent review article, Handbook of Thin Film Materials, vol. 1: Deposition and Processing of Thin Films, Chapter 2 "Atomic Layer Deposition", pp. 103-159, Academic Press 2002.

T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994.

* cited by examiner

Primary Examiner — Kenneth A Bratland, Jr.
(74) Attorney, Agent, or Firm — Seppo Laine Oy

(57) ABSTRACT

The present invention generally related to adding Indium precursors to deposition processes for thin films. Indium precursors are added in order to increase the growth rate per cycle of the deposition process. A plurality of deposition processes are disclosed herein which comprising a plurality of deposition cycles and providing an In-precursor pulse before at least one reactant pulse in at least one deposition cycle. The In-precursor can be added for increasing the average growth rate per cycle by at least 50% and in many examples above 500% compared to the growth rate of a similar deposition process without providing an In-precursor. Examples disclosed herein include the deposition of thin films comprising pnictides or chalcogenides, made by atomic layer deposition.

16 Claims, No Drawings

US 9,428,842 B2

METHODS FOR INCREASING GROWTH RATE DURING ATOMIC LAYER DEPOSITION OF THIN FILMS

FIELD OF THE INVENTION

The present application relates generally to methods for increasing growth rate of thin films, preferably thin films comprising pnictides or chalcogenides, made by atomic layer deposition.

BACKGROUND OF THE INVENTION

With continuing demand of the industry, deposition of films with increased growth rate meaning increased throughput in high-volume manufacturing is desirable. Traditional ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the additional gas phase reactants of the same pulse. A subsequent pulse of different reactants reacts with the previous termination to enable continued deposition. Thus each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

As described herein, Atomic Layer Deposition (ALD) processes can be used to deposit thin films comprising pnictogens and chalcogenides, wherein some of those materials contain Antimony (Sb) and Tellurium (Te). Such thin films can be related to phase change materials and used for phase change memory (PCM) technology. Deposition of Te or (Selenium) Se containing films by ALD or group VA element, e.g. pnictide, films by ALD are described, for example, in U.S. Patent Application No. 20100009078 and U.S. Patent Application No. 20090324821 and International Patent Application Publication WO2011/056519 (PCT application No. PCT/US/2010/053982), the disclosures of which all are incorporated herein by reference in their entirety.

As described herein, VA elements refer to group VA under the American, Chemical Abstract Service (CAS), system which is synonymous with Group 15 under the new International Union of Pure and Applied Chemistry (IUPAC) system and VB under the old IUPAC system. VA elements as referred to herein are also known as the pnictogens or nitrogen family and includes nitrogen (N), phosphorus (P), arsenic (As), antimony (Sb) and bismuth (Bi). Thin films comprising group VA elements, Te, Se or a combination thereof are used in many different applications, including, for example, non-volatile phase-change memories (PCM), solar cells, III-V compounds and optical storage materials. III-V compound semiconductors can be used in many different application areas, including transistors, optoelectronics and other application areas, for example, in bipolar transistors, field effect transistors, lasers, IR detectors, LEDs, wide band gap semiconductors, quantum well or quantum dot structures, solar cells and in monolithic microwave integrated circuits.

The operation of PCM cells is based on the resistivity difference between amorphous and crystalline states of the active material. A resistivity difference of more than three orders of magnitude can be obtained by many different phase change alloys. The switching in a PCM cell is generally accomplished by heating the material locally with suitable current pulses, which, depending on the intensity of the pulse, leave the material in a crystalline or amorphous state.

A wide variety of different PCM cell structures have been reported, many of which use trench or pore-like structures. Sputtering has typically been used in preparing PCM materials, but the more demanding cell structures will require better conformality and more control of the deposition process. Sputtering may be capable of forming simple pore and trench structures, however, more advanced PCM applications require more complicated 3-D cell structures that cannot be formed using sputtering techniques. Processes with greater precision and control, such as atomic layer deposition (ALD), are required to make these complicated structures. Using an atomic layer deposition process provides greater precision and control over the deposition, including better conformality and better control of the composition of the deposited film.

For PCM technology to compete with other memory technologies it is desirable to increase the throughput of the growth process of the PCM materials to decrease the cost associated per memory unit.

A need exists, therefore, for methods to increase the growth rate of an ALD process of the above mentioned materials including materials comprising group VA elements, Te, Se or a combination thereof.

SUMMARY OF THE INVENTION

It is an object of the present invention to provide an Indium precursor to deposition processes for thin films. Moreover, it is an aspect of the present invention to provide In-precursors in order to increase the growth rate of thin films in deposition processes.

It is an aspect of certain embodiments of the present invention to provide an atomic layer deposition (ALD) process having a growth process for forming a thin film containing a group VA element, Te, Se or combination thereof on a substrate in a reaction chamber, said ALD process comprising a plurality of deposition cycles and providing an In-precursor pulse before at least one reactant pulse in at least one deposition cycle. Moreover, it is an aspect of certain examples to provide the In-precursor for increasing the average growth rate per cycle by at least 50% compared to the growth rate of a similar ALD process without providing an In-precursor. Examples of deposition cycles of such ALD processes can include providing a pulse of a first vapor phase reactant into the reaction chamber, removing excess first reactant from the reaction chamber, providing a pulse of a second vapor phase reactant into the reaction chamber, said second vapor phase reactant including a group VA element, Te, Se or combination thereof and removing excess second reactant and reaction byproducts, if any, from the reaction chamber.

Additionally, it is an aspect of certain embodiments of the present invention to provide an atomic layer deposition (ALD) process having a growth process for forming a thin film containing phase change materials on a substrate in a reaction chamber, said ALD process comprising a plurality of deposition cycles and providing an In-precursor pulse before at least one reactant pulse in at least one deposition cycle. Moreover, it is an aspect of certain examples to provide the In-precursor for increasing the average growth rate per cycle by at least 50% compared to the growth rate of a similar ALD process without providing an In-precursor. Examples of deposition cycles of such ALD processes can include providing a pulse of a first vapor phase reactant into the reaction chamber, removing excess first reactant from the reaction chamber, providing a pulse of a second vapor phase reactant into the reaction chamber, said second vapor phase reactant including an element for the formation of the phase change material and removing excess second reactant and reaction byproducts, if any, from the reaction chamber.

Furthermore, it is an aspect of certain embodiments of the present invention to provide a deposition process having a growth process for forming a thin film containing phase change materials on a substrate in a reaction chamber, said deposition process comprising a plurality of deposition cycles and providing an In-precursor pulse before at least one reactant pulse in at least one deposition cycle. Moreover, it is an aspect of certain examples to provide the In-precursor for increasing the average growth rate per cycle by at least 50% compared to the growth rate of a similar deposition process without providing an In-precursor. Examples of deposition cycles of such deposition processes can include providing a pulse of a first vapor phase reactant into the reaction chamber, removing excess first reactant from the reaction chamber, providing a pulse of a second vapor phase reactant into the reaction chamber, said second vapor phase reactant including an element for the formation of the phase change material and removing excess second reactant and reaction byproducts, if any, from the reaction chamber.

According to certain examples of the embodiments, the In-precursor pulse can be introduced with the second reactant pulse in one or more deposition cycles. Additionally, the In-precursor pulse can be introduced during the growth process of the thin film after a second reactant pulse and prior to removing excess second reactant and reaction byproducts in one or more deposition cycles.

Additionally, according to certain examples, there is provided an ALD wherein one or more deposition cycles comprises; providing an alkylsilyl precursor pulse before, with or after the second reactant pulse, and providing an In-precursor pulse which can be introduced before or after the alkylsilyl precursor pulse. The In-precursor pulse can be introduced after the alkylsilyl precursor pulse and before removing the excess second reactant and reaction byproducts. The In-precursor pulse can also be introduced after the alkylsilyl precursor pulse of one deposition cycle and before the first reactant pulse of the subsequent deposition cycle.

An In-precursor pulse can be introduced directly to a substrate and/or before a first vapor phase reactant pulse. Additionally, for example, an In-precursor can be introduced every $X^{th}$ deposition cycle, wherein X is a discrete number between 1 and 100. Examples of In-precursors include those which are organometallic precursors, trimethylindium, triethylindium or $InCl_3$.

Furthermore, the In-precursor can be provided in a sufficient number of deposition cycles within a process in order to increase the average growth rate per cycle of the thin film by at least 100% compared to the growth rate of a similar processes without providing an In-precursor. The In-precursor can also be provided in a predetermined number of deposition cycles within a process in order for the total percentage of In in the final thin film remains below 10%. Furthermore, the In-precursor can be provided in a sufficient number of deposition cycles within a process in order to increase the growth rate to at least 1.0 Å/cycle. The predetermined number of deposition cycles can be between 1 and the total number of deposition cycles of the process.

DETAILED DESCRIPTION OF EXEMPLARY EMBODIMENTS

Within the context of the present invention, "an ALD type process" generally refers to a process for depositing thin films on a substrate molecular layer by molecular layer. This controlled deposition is made possible by self-saturating chemical reactions on the substrate surface. Gaseous reactants are conducted alternately and sequentially into a reaction chamber and contacted with a substrate located in the chamber to provide a surface reaction. Typically, a pulse of a first reactant is provided to the reaction chamber where it chemisorbs to the substrate surface in a self-limiting manner. Excess first reactant is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited.

The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

Gas phase reactions between precursors and any undesired reactions with by-products are preferably inhibited or prevented. Reactant pulses are separated from each other and the reaction chamber is purged with the aid of an inactive gas (e.g. nitrogen or argon) and/or evacuated between reactant pulses to remove surplus gaseous reactants and reaction by-products from the chamber.

An extensive description of ALD precursors and ALD-grown materials has been presented by Prof. M. Ritala and Prof M. Leskela in a recent review article, Handbook of Thin Film Materials, Vol. 1: Deposition and Processing of Thin Films, Chapter 2 "Atomic Layer Deposition", pp. 103-159, Academic Press 2002, incorporated by reference herein.

In context of the present application "a reaction space" designates generally a reaction chamber, or a defined volume therein, in which the conditions can be adjusted so that deposition of a thin film is possible.

In context of the present application, "an ALD type reactor" is a reactor where the reaction space is in fluid communication with an inactive gas source and at least one, preferably at least two precursor sources such that the precursors can be pulsed into the reaction space. The reaction space is also preferably in fluid communication with a vacuum generator (e.g. a vacuum pump), and the temperature and pressure of the reaction space and the flow rates of gases can be adjusted to a range that makes it possible to grow thin films by ALD type processes.

As is well known in the art, there are a number of variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. For the purpose of the present invention, the term "ALD" covers both PEALD and thermal ALD.

Optionally, an inactive gas can be used as a carrier gas during deposition. Inactive gas may also be used to purge the reaction chamber of excess reactant and reaction by-products, if any, between reactant pulses.

The deposition can be carried out at normal pressure, but it is preferred to operate the process at reduced pressure. Thus, the pressure in the reactor is typically 0.01-20 mbar, preferably 0.1-5 mbar.

The reaction temperature can be varied depending on the evaporation temperature and the decomposition temperature of the precursor. In some embodiments the range is from about 0 to 600° C., in particular about 25 to 500° C. The substrate temperature is preferably low enough to keep the bonds between thin film atoms intact and to prevent thermal decomposition of the gaseous reactants. On the other hand, the substrate temperature is preferably high enough to keep the source materials in gaseous phase and avoid condensation. Further, the temperature is preferably sufficiently high to provide the activation energy for the surface reaction. In preferred embodiments the deposition temperature is preferably between about 30 and about 300° C.

For further details on the operation of a typical ALD process, reference is made to the documents cited above.

The substrate can be of various types. Examples include, without limitation, silicon, silica, coated silicon, germanium, silicon-germanium alloys, copper metal, noble and platinum metals group including silver, gold, platinum, palladium, rhodium, iridium and ruthenium, nitrides, such as transition metal nitrides, e.g. tantalum nitride TaN, carbides, such as transition metal carbides, e.g. tungsten carbide WC, and nitride carbides, e.g. tungsten nitride carbide $WN_xC_y$. The preceding thin film layer deposited on the substrate, if any, will form the substrate surface for the next thin film.

While the embodiments of the present invention are discussed in the general context of PCM, the skilled artisan will appreciate that the principles and advantages taught herein will have application to other devices and applications. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added.

Antimony-telluride (including Sb—Te and $Sb_2Te_3$), Germanium-telluride (including GeTe), germanium-antimony-telluride (GST; $Ge_2Sb_2Te_5$), bismuth-telluride BiTe (including $Bi_2Te_3$), and zinc-telluride (including ZnTe) thin films can be deposited on a substrate by atomic layer deposition (ALD) type processes. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Tellurium has several oxidation states, including −2, 0, +2, +4, and +6. Antimony has several oxidation states, including −3, +3, 0 and +5, of which +3 is most common A stoichiometric Sb—Te film with Te in a −2 oxidation state comprises $Sb_2Te_3$. Germanium (Ge) has oxidation states of 0, +2, and +4.

Tellurium (Te) compounds, where Te has an oxidation state of −2, are generally called tellurides. Tellurium compounds, where Te has an oxidation state of 0, are generally called tellurium compounds. However, for the sake of simplicity, as used herein thin films comprising Te are referred to as tellurides. Thus films referred to as tellurides herein may contain Te with oxidations states other than −2, for example, oxidation states of 0, +2, +4, and +6. It will be apparent to the skilled artisan when a particular oxidation state is intended.

Antimony has several oxidation states, including −3, +3, 0 and +5, of which +3 is most common Germanium (Ge) has oxidation states of 0, +2, and +4.

Briefly, a substrate is loaded into a reaction chamber and is heated to a suitable deposition temperature, generally pressure below atmospheric pressure. Deposition temperatures are maintained below the thermal decomposition temperature of the reactants but at a high enough level to avoid condensation of reactants and to provide the activation energy for the desired surface reactions. The appropriate temperature window for any given ALD reaction will depend upon the surface termination and reactant species involved. Here, the temperature varies depending on the type of film being deposited and is preferably at or below about 400° C., more preferably at or below about 200° C. and most preferably from between at or about 20° C. to at or about 200° C.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated in their entirety herein by reference.

Precursors that may be used in various ALD processes disclosed herein are discussed in U.S. Patent Application published No. 2010/0009078, U.S. Patent Application published No. 2009/0324821 and International Patent Application Publication WO2011/056519 (PCT application No. PCT/US2010/053982), all of which are herein incorporated by reference in their entirety. Preferably these precursors include an alkylsilyl-precursor of group VA elements, Te, Se, or a combination thereof. More specifically, certain examples of precursors include alkylsilyl-precursors comprising Sb, As, Te or Se.

By introducing an Indium (In)-precursor in the growth process of materials described above, the growth rate of the material can be increased. Therefore, it is possible to increase the throughput of the process and decreasing the cost of the process, for example decreasing the cost of one phase change memory unit.

A pulse of an In-precursor can be introduced at any time during a growth process of a deposition process. For example, in a deposition process having a first and second reactant, e.g. a vapor phase reactants, an In-precursor as described herein can be added at any time. As such, a pulse of an In-precursor can be introduced before, with or after either a first, second or additional reactant in any given deposition cycle. Additionally, according to certain examples, a pulse of an In-precursor can even be introduced directly to a substrate prior to a first reactant.

As described herein, a deposition process can be, for example, an ALD process. However, the deposition process can also be a non-self limiting process, e.g. an ALD type process in which more than a single atomic layer of material is deposited in a given cycle or another, non-ALD type deposition process.

According to certain embodiments, a pulse of an In-precursor is introduced to an ALD growth process in which the reactant materials comprise group VA elements, Te, Se or a combination thereof. The introduction of the In-precursor increases the growth rate per cycle by more than 50%.

The introduction of the In-precursor can be for increasing, for example, the average growth rate per cycle of a deposition process compared to a similar process which does not include the introduction of an In-precursor. The introduction of the In-precursor can increase the average growth rate from more than 25% to more than 600%. The introduction of the In-precursor can be for increasing the average growth rate more than 50%, preferably more than 100%, more preferably more than 200%, still more preferably more than 300%, yet still more preferably more than 400% compared to average growth rate of process where an In-precursor is not introduced.

According to certain embodiments, a pulse of an In-precursor is introduced during the growth process of a thin film comprising phase change materials. Examples of such materials are those including CVD materials. Additional examples are those phase change materials and phase change material elements used in phase change memory, for example, $Ge_2Sb_2Te_5$ (GST) and its alternatives. Introduction of an In-precursor during the growth process will increase the throughput (e.g. the deposited thickness of the phase change material during a certain period of time) of the process more than 25%. Major economical savings or costs reductions can already be achieved with the growth rate or throughput increase of more than 25%.

The introduction of the In-precursor can be for increasing, for example, the throughput of a deposition process compared to a similar process which does not include the introduction of an In-precursor. The introduction of the In-precursor can increase the throughput from more than 25% to more than 600%. The introduction of the In-precursor can be for increasing the throughput more than 50%, preferably more than 100%, more preferably more than 200%, still more preferably more than 300%, yet still more preferably more than 400% compared to throughput of process where an In-precursor is not introduced.

According to certain embodiments, a pulse of an In-precursor is introduced to an ALD growth process in which the reactant materials comprise group VA elements, Te, Se or a combination thereof. Such a pulse will increase the growth rate per cycle to a level of at or above about 1.0 Å/cycle.

The introduction of the In-precursor can be for increasing, for example, the growth rate per cycle of a deposition process compared to a similar process which does not include the introduction of an In-precursor. The introduction of the In-precursor can be for increasing the growth rate per cycle to a level at or above about 1.0 Å/cycle, preferably to a level at or above about 1.3 Å/cycle, more preferably to a level at or above about 1.6 Å/cycle, still more preferably to a level at or above about 2.0 Å/cycle.

According to certain examples, the pulse of an In-precursor is introduced every cycle to an ALD process. According to other examples, the pulse of an In-precursor is introduced less than every $2^{nd}$ cycle to an ALD process. According to further examples, the pulse of an In-precursor precursor is introduced less than every cycle to an ALD process. Still further, according to certain examples, the pulse of In-precursor is introduced less than every $5^{th}$ cycle to ALD process. According to additional examples, the pulse of In-precursor is introduced, for example, less than every $10^{th}$, $25^{th}$, $50^{th}$ or $100^{th}$ cycle to an ALD process. In all of the above-mentioned examples in which the In-precursor is introduced at every, or less than every $X^{th}$ cycle between 1 and 100, the growth rate per cycle is increased.

According to certain embodiments, the In-precursor is a metal-organic In-precursor. More specifically, according to certain examples the In-precursor is an organometallic In-precursor comprising a direct bond between In and C. According to certain examples, the In-precursor comprises methyl or ethyl ligand. Further examples of the In-precursor include either trimethylindium (TMIn) or triethylindium (TEIn). In an embodiment the In-precursor is triethylindium (TEIn). The In-precursor can also be, for example, $InR_3$, in which case each R can be independently selected to be a C1-C5 hydrocarbon group. Furthermore, the In-precursor can be a 2,4-pentanedione indium [tris(acetylacetonato) indium i.e $In(acac)_3$] or a, 2,6,6-tetra-methyl-3,5-heptanedione indium $[In(thd)_3]$. The In-precursor may also comprise cyclopentadienyl (Cp) ligand. An example of an In-precursor is InCp. Additionally, the In-precursor may comprise a halide, such as a chlorine atom. A further example of an In-precursor is $InCl_3$.

According to certain embodiments, a first precursor is utilized in an ALD process for depositing films comprising group VA elements, Te, Se or a combination thereof in addition to an In-precursor. Such first precursors may comprise an alkylsilyl-precursor as described, for example, in U.S. 2010/0009078 and International Patent Application Publication WO2011/056519 (PCT application No. PCT/US/2010/053982). According to certain examples, an In-precursor pulse as described above is introduced to the growth process after the first precursor pulse, e.g. the alkylsilyl precursor pulse. Additionally, according to certain examples, an In-precursor pulse as described above is introduced to the growth process after the first precursor pulse, e.g. the alkylsilyl precursor pulse, and after a purging step with, for example, an inert gas. According to certain examples, an In-precursor pulse as described above is introduced to the growth process after the first precursor pulse but before a subsequent precursor pulse. For example, the In-precursor pulse is introduced after a first precursor pulse, e.g. an alkylsilyl precursor pulse, and before the next precursor pulse containing a halide.

According to certain examples, when an In-precursor is introduced to the growth process and the growth rate per cycle is increased, less than or about 30 at-% of In, preferably less than or about 15 at-% of In, more preferably less than or about 10 at-% of In and most preferably less than or about 5 at-% of In is incorporated in to the film. Furthermore, according to some examples, less than or about 1 at-% of In is incorporated to the film.

It will be appreciated by those skilled in the art that various modifications and changes can be made without departing from the scope of the invention. Similar other modifications and changes are intended to fall within the scope of the invention, as defined by the appended claims.

The following examples demonstrate the increased growth rate when an In-precursor is introduced to a growth process.

EXAMPLE 1

A standard GeSbTe process comprises $Sb_2Te_3$, Sb and GeTe subcycles, all of which have a growth rate below 0.6 Å/cycle at a studied deposition temperature of 100° C. An InGeSbTe film, where an In-precursor pulse containing triethylindium (TEIn) was applied after every $50^{th}$ subcycle, achieved a growth rate of 2.06 Å/cycle. The TEIn pulse was always applied after a $(Et_3Si)_2Te$ pulse. One thing that is noteworthy is that the high growth rate is not caused by excessive In incorporated within the film. The composition, measured by EDX analysis, was: In 2.75%, Ge 5.25%, Sb 63.28% and Te 28.73%. The processes used for the subcycles were $SbCl_3+(Et_3SO_2Te$ for $Sb_2Te_3$, $SbCl_3+(Et_3Si)_3Sb$ for Sb and $GeCl_2$–dioxane+$(Et_3Si)_2Te$ for GeTe.

EXAMPLE 2

A standard Sb process ($SbCl_3+(Et_3Si)_3Sb$) had a growth rate of 0.36 Å/cycle at a studied deposition temperature of 100° C. in an F-120 reactor. Utilizing an In-precursor of TEIn and a deposition sequence of 1000×(TEIn+$SbCl_3$+$(Et_3Si)_3Sb$) a film with a thickness of 210 nm was deposited. Thus a growth rate of 2.1 Å/cycle was achieved. Similarly, the film composition measured by EDX analysis was In 2.2%, Sb 97.8% indicating that the high growth rate was not caused by an excess of In.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. An atomic layer deposition (ALD) process having a growth process for forming a thin film containing a group VA element, Te, Se or combination thereof on a substrate in a reaction chamber, said ALD process comprising a plurality of deposition cycles, wherein each deposition cycle comprises;
   providing a pulse of a first vapor phase reactant into the reaction chamber,
   removing excess first reactant from the reaction chamber,
   providing a pulse of a second vapor phase reactant into the reaction chamber, said second vapor phase reactant including a group VA element, Te, Se or combination thereof,
   removing excess second reactant and reaction byproducts, if any, from the reaction chamber, and
   wherein the ALD process further comprises introducing an In-precursor pulse during the growth process of the thin film after the second reactant pulse and prior to removing the excess second reactant and reaction byproducts in one or more deposition cycles.

2. An ALD process according to claim 1, wherein the second vapor phase reactant is an alkylsilyl precursor.

3. An ALD process according to claim 1, wherein the first reactant pulse is provided such that no more than about a single molecular layer of the first reactant is formed on the substrate.

4. An ALD process according to claim 1, wherein the In-precursor is introduced only every $2^{nd}$ deposition cycle.

5. An ALD process according to claim 1, wherein the In-precursor is introduced only every $X^{th}$ deposition cycle, wherein X is a discrete number between 3 and 100.

6. An ALD process according to claim 1, wherein the In-precursor is an organometallic precursor.

7. An ALD process according to claim 1, wherein the In-precursor is trimethylindium, triethylindium or $InCl_3$.

8. An ALD process according to claim 1, wherein the In-precursor is provided in a sufficient number of deposition cycles within the ALD process in order to increase the average growth rate per cycle of the thin film by at least 100% compared to the growth rate of a similar ALD processes without providing an In-precursor.

9. An ALD process according to claim 1, wherein the In-precursor is provided in a predetermined number of deposition cycles within the ALD process in order for the total percentage of In in the final thin film remains below 10%.

10. An ALD process according to claim 1, wherein the In-precursor is provided in a sufficient number of deposition cycles within the ALD process in order to increase the growth rate to at least 1.0 Å/cycle.

11. An atomic layer deposition (ALD) process having a growth process for forming a thin film containing a phase change material on a substrate in a reaction chamber, said ALD process comprising a plurality of deposition cycles, wherein each deposition cycle comprises;
providing a pulse of a first vapor phase reactant into the reaction chamber,
removing excess first reactant from the reaction chamber,
providing a pulse of a second vapor phase reactant into the reaction chamber, said second vapor phase reactant including an element for the formation of the phase change material,
removing excess second reactant and reaction byproducts, if any, from the reaction chamber, and
wherein the ALD process further comprises introducing an In-precursor pulse during the growth process of the thin film after the second reactant pulse and prior to removing the excess second reactant and reaction byproducts in one or more deposition cycle.

12. An ALD process according to claim 11, wherein the In-precursor is trimethylindium, triethylindium or $InCl_3$.

13. A deposition process having a growth process for forming a thin film containing a phase change material on a substrate in a reaction chamber, said growth process comprising a plurality of deposition cycles, wherein each deposition cycle comprises;
providing a pulse of a first vapor phase reactant into the reaction chamber,
removing excess first reactant from the reaction chamber,
providing a pulse of a second vapor phase reactant into the reaction chamber, said second vapor phase reactant including an element for the formation of the phase change material,
removing excess second reactant and reaction byproducts, if any, from the reaction chamber, and
wherein the growth process further comprises introducing an In-precursor pulse during the growth process of the thin film after the second reactant pulse and prior to removing the excess second reactant and reaction byproducts in one or more deposition cycle.

14. A deposition process according to claim 13, wherein the growth process of the deposition process is not self limiting.

15. An ALD process according to claim 1, wherein the second vapor phase reactant is an alkylsilyl precursor.

16. An ALD process according to claim 15, wherein the In-precursor is trimethylindium, triethylindium or $InCl_3$.

* * * * *